United States Patent
Takeuchi et al.

(10) Patent No.: US 11,111,407 B2
(45) Date of Patent: Sep. 7, 2021

(54) SEALING RESIN COMPOSITION, ELECTRONIC COMPONENT DEVICE, AND METHOD OF MANUFACTURING ELECTRONIC COMPONENT DEVICE

(71) Applicant: HITACHI CHEMICAL COMPANY, LTD., Tokyo (JP)

(72) Inventors: Yuma Takeuchi, Tokyo (JP); Hisato Takahashi, Tokyo (JP); Yoshihito Inaba, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 208 days.

(21) Appl. No.: 16/341,764

(22) PCT Filed: Sep. 26, 2017

(86) PCT No.: PCT/JP2017/034810
§ 371 (c)(1),
(2) Date: Apr. 12, 2019

(87) PCT Pub. No.: WO2018/070237
PCT Pub. Date: Apr. 19, 2018

(65) Prior Publication Data
US 2019/0233672 A1    Aug. 1, 2019

(30) Foreign Application Priority Data

Oct. 14, 2016 (JP) .............. JP2016-202714

(51) Int. Cl.
| | | |
|---|---|---|
| H01L 23/22 | (2006.01) | |
| C09D 163/00 | (2006.01) | |
| C09D 7/61 | (2018.01) | |
| H01L 21/56 | (2006.01) | |
| H01L 23/29 | (2006.01) | |
| H01L 23/31 | (2006.01) | |
| C08G 59/50 | (2006.01) | |
| C08L 63/00 | (2006.01) | |
| C08K 3/00 | (2018.01) | |

(52) U.S. Cl.
CPC .......... C09D 163/00 (2013.01); C08G 59/50 (2013.01); C08K 3/00 (2013.01); C08L 63/00 (2013.01); C09D 7/61 (2018.01); H01L 21/56 (2013.01); H01L 23/29 (2013.01); H01L 23/295 (2013.01); H01L 23/31 (2013.01); H01L 23/3121 (2013.01)

(58) Field of Classification Search
CPC ....... H01L 23/29; H01L 23/295; H01L 23/31; H01L 23/3121; H01L 21/56; C09D 163/00; C09D 7/61; C08G 59/50; C08K 3/00; C08L 63/00
USPC .................................................. 257/600, 687
See application file for complete search history.

(56) References Cited

U.S. PATENT DOCUMENTS

2010/0304536 A1   12/2010  Sumita et al.
2017/0145251 A1    5/2017  Ogawa et al.

FOREIGN PATENT DOCUMENTS

| JP | 2000-336247 A | 12/2000 |
|---|---|---|
| JP | 2003-292579 A | 10/2003 |
| JP | 2005-298740 A | 10/2005 |
| JP | 2007-197655 A | 8/2007 |
| JP | 2007204510 A * | 8/2007 |
| JP | 2009114222 A * | 5/2009 |
| JP | 2010-192525 A | 9/2010 |
| JP | 2011-006618 A | 1/2011 |
| JP | 2011-014885 A | 1/2011 |
| JP | 2012-107149 A | 6/2012 |
| JP | 2015-218229 A | 12/2015 |
| JP | 2016-098317 A | 5/2016 |

* cited by examiner

*Primary Examiner* — Brook Kebede
(74) *Attorney, Agent, or Firm* — Fitch, Even, Tabin & Flannery, LLP

(57) ABSTRACT

A sealing resin composition contains an epoxy resin (A), a curing agent (B) having at least one amino group in one molecule, and an inorganic filler (C), wherein the inorganic filler (C) contains a first inorganic filler (C1) having an average particle size from 0.1 μm to 20 μm and a second inorganic filler (C2) having an average particle size from 10 nm to 80 nm, and a value obtained by multiplying a specific surface area of the inorganic filler (C), by a proportion of a mass of the inorganic filler (C) in a solid mass of the sealing resin composition, is 4.0 $mm^2$/g or more.

16 Claims, No Drawings

SEALING RESIN COMPOSITION, ELECTRONIC COMPONENT DEVICE, AND METHOD OF MANUFACTURING ELECTRONIC COMPONENT DEVICE

CROSS-REFERENCE TO RELATED APPLICATIONS

This application is a U.S. national phase application filed under 35 U.S.C. § 371 of International Application No. PCT/JP2017/034810, filed Sep. 26, 2017, which claims priority from Japanese Patent Application No. 2016-202714, filed Oct. 14, 2016, the entire contents of each of which are hereby incorporated herein by reference.

TECHNICAL FIELD

The present invention relates to a sealing resin composition, an electronic component device, and a method of manufacturing an electronic component device.

BACKGROUND ART

Flip-chip bonding has been recently utilized in semiconductor chip-mounting systems where system-in-packages are adopted, in order to handle a further increase in density of wiring for electronic equipment. Packages obtained by flip-chip bonding are called "flip-chip packages (FC-PKGs)". In such FC-PKGs, gaps between semiconductor chips and substrates are sealed with liquid resin compositions called underfill materials.

FC-PKGs have been recently increasingly demanded in mobile applications and semiconductor modules have been particularly increased where small-sized flip-chip chip-size packages (FC-CSPs) are adopted. PKGs in such FC-CSPs currently have a size of about 20 mm or less×20 mm or less×2 mm, and are demand to be further reduced in size.

Bleeding is here exemplified as one problem about underfill materials for semiconductors, which seal gaps between semiconductor chips and substrates. Bleeding in FC-PKGs means a phenomenon where liquid components in sealants for semiconductors, as liquid resin compositions, are spread and bled out on surfaces of solder resists provided on substrates located below semiconductor chips. The occurrence of bleeding may cause connection circuits near FC-PKGs disposed to be contaminated.

Accordingly, various studies have been recently made in order not to cause the occurrence of such bleeding on surfaces of solder resists. There have been reported, in order to overcome bleeding, a liquid sealing resin composition including an acrylate-siloxane copolymer (see, for example, Patent Literature 1), a liquid sealing resin composition including a silicone oil containing an amino group (see, for example, Patent Literature 2), and a liquid sealing resin composition including a liquid silicone compound having a polyether group and a liquid silicone compound having an amino group (see, for example, Patent Literature 3).

CITATION LIST

Patent Literature

[Patent Literature 1] Japanese Patent Application Laid-Open (JP-A) No. 2011-6618
[Patent Literature 2] JP-A No. 2010-192525
[Patent Literature 3] JP-A No. 2012-107149

SUMMARY OF INVENTION

Technical Problems

However, a concern due to addition of a siloxane copolymer or a silicone compound is a reduction in surface tension of a liquid resin composition. Such a reduction in surface tension of a liquid resin composition can lead to deterioration in package injection performance in use of a liquid resin composition as an underfill material. Thus, a material is demanded which can allow bleeding to be suppressed with neither a siloxane copolymer nor a silicone compound.

The invention has been made in view of the above circumstances, and an object thereof is to provide a sealing resin composition that can allow bleeding to be suppressed as well as an electronic component device using the composition and a method of manufacturing the device.

Solution to Problem

Concrete means for achieving the above-described object are as follows.

<1> A sealing resin composition comprising:
an epoxy resin (A), a curing agent (B) having at least one amino group in one molecule, and an inorganic filler (C), wherein:
the inorganic filler (C) comprises a first inorganic filler (C1) having an average particle size from 0.1 µm to 20 µm and a second inorganic filler (C2) having an average particle size from 10 nm to 80 nm, and
a value obtained by multiplying a specific surface area of the inorganic filler (C), by a proportion of a mass of the inorganic filler (C) in a solid mass of the sealing resin composition, is 4.0 mm$^2$/g or more.

<2> The sealing resin composition according to <1>, having a viscosity, at 110° C., of 0.20 Pa·s or less.

<3> The sealing resin composition according to <1> or <2>, wherein a proportion of the second inorganic filler (C2) having an average particle size from 10 nm to 80 nm in the inorganic filler (C) is 0.3% by mass or more.

<4> The sealing resin composition according to any one of <1> to <3>, wherein a proportion of the second inorganic filler (C2) having an average particle size from 10 nm to 80 nm in the inorganic filler (C) is 30% by mass or less.

<5> The sealing resin composition according to any one of <1> to <4>, wherein a proportion of the first inorganic filler (C1) having an average particle size from 0.1 µm to 20 µm in the inorganic filler (C) is 70% by mass or more.

<6> The sealing resin composition according to any one of <1> to <5>, having a viscosity, at 25° C., from 0.1 Pa·s to 50.0 Pa·s.

<7> The sealing resin composition according to any one of <1> to <6>, wherein the first inorganic filler (C1) having an average particle size from 0.1 µm to 20 µm comprises silica.

<8> The sealing resin composition according to any one of <1> to <7>, wherein the second inorganic filler (C2) having an average particle size from 10 nm to 80 nm comprises silica.

<9> The sealing resin composition according to any one of <1> to <8>, wherein a content of the inorganic filler (C) is from 40% by mass to 85% by mass.

<10> The sealing resin composition according to any one of <1> to <9>, wherein a specific surface area of the first inorganic filler (C1) having an average particle size from 0.1 µm to 20 µm is from 1 mm$^2$/g to 30 mm$^2$/g.

<11> The sealing resin composition according to any one of <1> to <10>, wherein a specific surface area of the second inorganic filler (C2) having an average particle size from 10 nm to 80 nm is from 20 mm$^2$/g to 500 mm$^2$/g.

<12> The sealing resin composition according to any one of <1> to <11>, having a thixotropic index, at 25° C., from 0.5 to 1.5.

<13> An electronic component device comprising:
a substrate having a circuit layer,
an electronic component disposed on the substrate and electrically connected to the circuit layer, and
a cured product of the sealing resin composition according to any one of <1> to <12>, disposed in a gap between the substrate and the electronic component.

<14> A method of manufacturing an electronic component device, comprising: a step of sealing, with the sealing resin composition according to any one of <1> to <12>, a substrate having a circuit layer and an electronic component disposed on the substrate and electrically connected to the circuit layer.

Advantageous Effects of Invention

The invention can provide a sealing resin composition that can allow bleeding to be suppressed as well as an electronic component device using the composition and a method of manufacturing the device.

DESCRIPTION OF EMBODIMENTS

Embodiments of the invention are described below in detail. It is noted here, however, that the invention is not restricted to the below-described embodiments. In the below-described embodiments, the constituents thereof (including element steps and the like) are not indispensable unless otherwise specified. The same applies to the numerical values and ranges thereof, without restricting the invention.

In the present specification, the term "step" encompasses not only steps discrete from other steps but also steps which cannot be clearly distinguished from other steps, as long as the intended purpose of the step is achieved.

In the present specification, those numerical ranges that are expressed with "to" each denote a range that includes the numerical values stated before and after "to" as the minimum value and the maximum value, respectively.

In a set of numerical ranges that are stated stepwisely in the present specification, the upper limit value or the lower limit value of a numerical range may be replaced with the upper limit value or the lower limit value of other numerical range. Further, in a numerical range stated in the present specification, the upper limit value or the lower limit value of the numerical range may be replaced with a relevant value indicated in any of Examples.

In the present specification, when there are plural kinds of substances that correspond to a component of a composition, the indicated content ratio or amount of the component in the composition means, unless otherwise specified, the total content ratio or amount of the plural kinds of substances existing in the composition.

In the present specification, when there are plural kinds of particles that correspond to a component of a composition, the indicated particle size of the component in the composition means, unless otherwise specified, a value determined for a mixture of the plural kinds of particles existing in the composition.

Herein, the term "layer" includes, when observing a region where a layer is present, a case in which the layer is formed only on a part of the region in addition to a case in which the layer is formed on the entirety of the region.

<Sealing Resin Composition>

The sealing resin composition of the present disclosure includes an epoxy resin (A), a curing agent (B) having at least one amino group in one molecule, and an inorganic filler (C), wherein the inorganic filler (C) includes a first inorganic filler (C1) having an average particle size from 0.1 μm to 20 μm and a second inorganic filler (C2) having an average particle size from 10 nm to 80 nm, and a value obtained by multiplying a specific surface area of the inorganic filler (C), by a proportion of a mass of the inorganic filler (C) in a solid mass of the sealing resin composition, is 4.0 mm$^2$/g or more.

Hereinafter, the details of respective components constituting the sealing resin composition will be described.

—Epoxy Resin—

The epoxy resin as the component (A) imparts curability and adhesiveness to the sealing resin composition, and imparts heat resistance and durability to a cured product of the sealing resin composition. The epoxy resin is preferably a liquid epoxy resin. The liquid epoxy resin can also be used in combination with a solid epoxy resin in the disclosure as long as suppression of bleeding is achieved.

The liquid epoxy resin here means an epoxy resin that is liquid at ordinary temperature (25° C.). Specifically, it is meant that the viscosity measured at 25° C. with an E-type viscometer is 1000 Pa·s or less. The viscosity is specifically defined as a measurement value taken after a lapse of one minute from the start of measurement with an E-type viscometer EHD Model (cone angle 3°, cone diameter 28 mm) at a measurement temperature of 25° C. and a sample volume of 0.7 mL with the rotational speed being set depending on the viscosity of such a sample to be expected with reference to the following.

(1) a case in which the viscosity to be expected is from 100 Pa·s to 1000 Pa·s: rotational speed 0.5 rpm (2) a case in which the viscosity to be expected is less than 100 Pa·s: rotational speed 5 rpm The solid epoxy resin means an epoxy resin that is solid at ordinary temperature (25° C.).

The type of the epoxy resin is not particularly limited. Examples of the epoxy resin include naphthalene-type epoxy resins; diglycidyl ether-type epoxy resins such as bisphenol A, bisphenol F, bisphenol AD, bisphenol S, and hydrogenated bisphenol A; epoxidized products of novolac resins of phenol and aldehyde, typified by o-cresol novolac-type epoxy resins; glycidyl ester-type epoxy resins obtained by a reaction of polybasic acid such as phthalic acid or dimer acid with epichlorohydrin; and glycidyl amine-type epoxy resins obtained by a reaction of an amine compound such as diaminodiphenylmethane or isocyanuric acid with epichlorohydrin.

An epoxy equivalent of the epoxy resin is preferably from 80 g/eq to 250 g/eq, more preferably from 85 g/eq to 240 g/eq, still more preferably from 90 g/eq to 230 g/eq from the viewpoint of adjustment of the viscosity.

The epoxy equivalent of the epoxy resin is measured by dissolving the epoxy resin weighed, in a solvent such as methyl ethyl ketone, adding acetic acid and a tetraethylammonium bromide-acetic acid solution thereto, and performing potentiometric titration with a perchloric acid-acetic acid standard solution. An indicator may also be used in such titration.

A commercially available product may also be used as the epoxy resin. Specific examples of such a commercially available product of the epoxy resin include an amine-type epoxy resin (trade name: jER630) manufactured by Mitsubishi Chemical Corporation, a bisphenol F-type epoxy resin (trade name: YDF-8170C) manufactured by NIPPON STEEL & SUMIKIN CHEMICAL CO., LTD., a bisphenol A-type epoxy resin (trade name: YD-128) manufactured by NIPPON STEEL & SUMIKIN CHEMICAL CO., LTD., and a naphthalene-type epoxy resin (trade name: HP-4032D) manufactured by DIC CORPORATION. The epoxy resin is not limited to these specific examples. The epoxy resin may be used singly, or in combination of two or more kinds thereof.

The content of the epoxy resin is not particularly limited, and is preferably from 5% by mass to 28% by mass, more preferably from 7% by mass to 17% by mass, still more preferably from 10% by mass to 15% by mass, for example, as the proportion in the solid of the sealing resin composition.

—Curing Agent Having at Least One Amino Group in One Molecule—

The curing agent having at least one amino group in one molecule (hereinafter, sometimes referred to as "specified curing agent".) as the component (B) may be any curing agent that can impart curing by polymerization together with the epoxy resin, and can be used in the form of a liquid or solid as long as the sealing resin composition has fluidity at room temperature (25° C.) in the case of such a curing agent included in the sealing resin composition.

Examples of the specified curing agent include an amine-based curing agent and a carboxylic acid dihydrazide curing agent. The specified curing agent is preferably an amine-based curing agent from the viewpoint of, for example, fluidity and pot life properties.

Examples of the amine-based curing agent include linear aliphatic amine, cyclic aliphatic amine, aliphatic-aromatic amine, and aromatic amine, and an aromatic amine is preferable in terms of heat resistance and electric characteristics.

Specific examples of the amine-based curing agent include aromatic amine curing agents having one aromatic ring, such as m-phenylenediamine, 1,3-diaminotoluene, 1,4-diaminotoluene, 2,4-diaminotoluene, 3,5-diethyl-2,4-diaminotoluene, 3,5-diethyl-2,6-diaminotoluene, and 2,4-diaminoanisole; aromatic amine curing agents having two aromatic rings, such as 4,4'-diaminodiphenylmethane, 4,4'-diaminodiphenylsulfone, 4,4'-methylenebis(2-ethylaniline), 3,3'-diethyl-4,4'-diaminodiphenylmethane, 3,3',5,5'-tetramethyl-4,4'-diaminodiphenylmethane, and 3,3',5,5'-tetraethyl-4,4'-diaminodiphenylmethane; hydrolysis condensates of aromatic amine curing agents; aromatic amine curing agents having a polyether structure, such as polytetramethylene oxide di-p-aminobenzoic acid ester and polytetramethylene oxide di-p-aminobenzoate; condensates of aromatic diamine with epichlorohydrin; and reaction products of aromatic diamine with styrene.

A commercially available product may also be used as the specified curing agent. Specific examples of such a commercially available product of the specified curing agent include an amine curing agent (trade name: KAYAHARD-AA) manufactured by Nippon Kayaku Co., Ltd., and amine curing agents (trade name: jER Cure (registered trademark) 113 and trade name: jER Cure (registered trademark) W) manufactured by Mitsubishi Chemical Corporation, and the specified curing agent is not limited to these specific examples. The specified curing agent may be used singly, or in combination of two or more kinds thereof.

The ratio of the number of equivalents of the specified curing agent to the number of equivalents of the epoxy resin, included in the sealing resin composition, is not particularly limited. To minimize an unreacted portion of each component, the ratio of the number of equivalents of the specified curing agent to the number of equivalents of the epoxy resin (the number of equivalents of the specified curing agent/the number of equivalents of the epoxy resin) is preferably set within a range of from 0.6 to 1.4, more preferably set within a range of from 0.7 to 1.3, still more preferably set within a range of from 0.8 to 1.2.

The sealing resin composition may include, if necessary, any curing agent other than the specified curing agent. Examples of such any other curing agent include a phenol-based curing agent, an acid anhydride-based curing agent, and an imidazole-based curing agent.

—Inorganic Filler—

As the inorganic filler of the component (C), a first inorganic filler (C1) having an average particle size of from 0.1 µm to 20 µm and a second inorganic filler (C2) having an average particle size of from 10 nm to 80 nm are used in combination.

Examples of the inorganic filler include inorganic particles such as silica including colloidal silica, hydrophobic silica and spherical silica, and talc, as well as organic particles. The inorganic filler is preferably amorphous spherical silica from the viewpoints of fluidity in coating with the sealing resin composition and heat resistance of a cured product of the sealing resin composition.

The content of the inorganic filler is not particularly limited, and is preferably from 40% by mass to 85% by mass, more preferably from 46% by mass to 78% by mass, still more preferably from 50% by mass to 70% by mass, for example, as the proportion in the solid of the sealing resin composition.

The first inorganic filler (C1) imparts heat cycle resistance, moisture resistance, insulation properties, and the like to a cured product of the sealing resin composition. The first inorganic filler (C1) reduces stress during curing of the sealing resin composition.

The average particle size of the first inorganic filler is from 0.1 µm to 20 µm, preferably from 0.2 µm to 10 µm, more preferably from 0.2 µm to 8 µm, still more preferably from 0.3 µm to 5 µm.

The specific surface area of the first inorganic filler is preferably from 1 mm$^2$/g to 30 mm$^2$/g, more preferably from 2 mm$^2$/g to 20 mm$^2$/g from the viewpoint of fluidity.

The proportion of the first inorganic filler in the inorganic filler is preferably 70% by mass or more. The proportion of the first inorganic filler in the inorganic filler is preferably 99.7% by mass or less. The proportion of the first inorganic filler in the inorganic filler is more preferably from 70% by mass to 99.7% by mass, still more preferably from 75% by mass to 99.5% by mass.

A BET method is mainly applied to the method of measuring the specific surface area of the inorganic filler. A BET method is a gas adsorption method involving allowing a molecule of an inert gas such as nitrogen ($N_2$), argon (Ar), or krypton (Kr) to adsorb to a solid particle, and determining the specific surface area of the solid particle from the amount of such a gas molecule for adsorption. The specific surface area can be measured with a specific surface area/pore distribution measuring apparatus (for example, SA3100 manufactured by Beckman Coulter, Inc.).

A commercially available product may also be used as the first inorganic filler. Specific examples of such a commercially available product of the first inorganic filler include spherical silica (trade name: SO-E2) manufactured by Admatechs and spherical silica (trade name: SE2200) manufactured by Admatechs, and the first inorganic filler is not limited to these specific examples. The average particle size of the first inorganic filler is here measured with a dynamic light scattering nanotrak particle size analyzer. Herein, the average particle size in the disclosure is defined as a particle size at a cumulative volume of 50% from the smaller size. The first inorganic filler may be used singly, or in combination of two or more kinds thereof.

The first inorganic filler may have an organic group derived from a raw material for production. Examples of the organic group that may be in the first inorganic filler include alkyl groups such as a methyl group and an ethyl group.

The amorphous spherical silica is also preferably amorphous spherical silica produced according to a sol-gel method in terms of control properties of the particle size and the purity. A composition may also be used which contains silica obtained according to the production method described in JP-A No. 2007-197655, as the above silica.

The second inorganic filler as the component (C2) is used to result in an enhancement in the effect of suppression of bleeding. The average particle size of the second inorganic filler is from 10 nm to 80 nm, preferably from 10 nm to 70 nm, more preferably from 10 nm to 60 nm. An average particle size of the second inorganic filler, of 10 nm or more, tends to hardly cause the sealing resin composition to be increased in viscosity and deteriorated in fluidity.

The specific surface area of the second inorganic filler is preferably from 20 $mm^2/g$ to 500 $mm^2/g$, more preferably from 50 $mm^2/g$ to 300 $mm^2/g$ from the viewpoint of fluidity.

A commercially available product may also be used as the second inorganic filler. Specific examples of such a commercially available product of the second inorganic filler include inorganic fillers (trade name: YA010C, YA050C, and the like) manufactured by Admatechs and inorganic fillers (trade name: Sciqas, 0.05 µm) manufactured by SAKAI CHEMICAL INDUSTRY CO., LTD., and the second inorganic filler is not limited to these specific examples. The second inorganic filler may be used singly, or in combination of two or more kinds thereof.

The proportion of the second inorganic filler in the inorganic filler is preferably 0.3% by mass or more. The proportion of the second inorganic filler in the inorganic filler is also preferably 30% by mass or less. The proportion of the second inorganic filler in the inorganic filler is more preferably from 0.3% by mass to 30% by mass, still more preferably from 0.5% by mass to 25% by mass. The proportion of the second inorganic filler in the inorganic filler can fall within the above range, thereby allowing a sealing resin composition being capable of exerting the effect of reduction of bleeding and being excellent in fluidity to be obtained.

The second inorganic filler can also be used with the particle surface being treated with an organic group in advance. The particle surface is preferably treated with an organic group in advance from the viewpoints of enhancements in adhesion forces to a semiconductor chip, an organic substrate, and the like, and an enhancement in toughness of a cured product of the sealing resin composition.

Whether or not the inorganic filler includes both the first inorganic filler and the second inorganic filler is confirmed by, for example, determining the particle size distribution (frequency distribution) on a volume basis. Specifically, it can be said that the inorganic filler includes both the first inorganic filler and the second inorganic filler, in a case in which respective peaks are present in a range of from 0.1 µm to 20 µm and in a range of from 10 nm to 80 nm in the frequency distribution of the inorganic filler on a volume basis. The confirmation method here is not limited to the above method.

The method of determining the proportion of the first or second inorganic filler in the inorganic filler is not particularly limited, and such a proportion is determined by, for example, determining the particle size distribution (frequency distribution) on a volume basis of the inorganic filler, cutting the valley between the peak corresponding to the first inorganic filler and the peak corresponding to the second inorganic filler for separation to both the respective peaks, and dividing the volume of the particle present within each range obtained by such cutting and separating, by the total volume of the inorganic filler. In a case in which the formulation of the sealing resin composition is clear, the proportion of the first or second inorganic filler in the inorganic filler can be determined from the formulation of the sealing resin composition. The calculation method here is not limited to the above method.

The value obtained by multiplying the specific surface area of the inorganic filler by the proportion of the mass of the inorganic filler in the solid mass is 4 $mm^2/g$ or more, preferably from 4 $mm^2/g$ to 30 $mm^2/g$, more preferably from 5 $mm^2/g$ to 26 $mm^2/g$, still more preferably from 6 $mm^2/g$ to 24 $mm^2/g$. The value obtained by multiplying the specific surface area of the inorganic filler by the proportion of the mass of the inorganic filler in the solid mass can fall within the above range, thereby allowing a sealing resin composition being capable of exerting the effect of reduction of bleeding and being excellent in fluidity to be obtained.

The specific surface area of the inorganic filler here refers to the weighted average between the specific surface area of the first inorganic filler and the specific surface area of the second inorganic filler. In a case in which any inorganic filler other than the first inorganic filler and the second inorganic filler is used in combination for the inorganic filler, the specific surface area of the inorganic filler here refers to the weighted average among the specific surface area of the first inorganic filler, the specific surface area of the second inorganic filler, and the specific surface area of such any other inorganic filler.

The "solid mass" refers to the mass of the solid contained in the sealing resin composition, and the solid means the remaining component resulting from removal of any volatile component such as an organic solvent from the sealing resin composition.

—Rubber Additive—

The sealing resin composition preferably contains rubber additive as a component (D) from the viewpoint of relaxing of stress of a cured product of the sealing resin composition. Examples of the rubber additive include acrylic rubber, urethane rubber, silicone rubber, and butadiene rubber. The rubber additive that can be used is any rubber additive that is solid at ordinary temperature (25° C.). The form of such rubber additive is not particularly limited, and any rubber additive in the form of a particle or pellet can be used. The average particle size of a rubber additive in the form of a particle is, for example, preferably 0.01 µm to 20 µm, more preferably 0.02 µm to 10 µm, still more preferably 0.03 µm to 5 µm.

The rubber additive that can be used is any rubber additive that is liquid at ordinary temperature (25° C.). Examples of such liquid rubber additive include polybutadiene, a butadiene-acrylonitrile copolymer, polyisoprene, polypropylene oxide, and polyorganosiloxane.

Such any rubber additive that is solid at ordinary temperature (25° C.) is preferably used with being heated and dissolved in the epoxy resin or the specified curing agent. Any rubber additive having a group reactive with an epoxy group at an end can be used. Such rubber additive having a group reactive with an epoxy group at an end may be in the form of a solid or liquid at ordinary temperature (25° C.).

A commercially available product may also be used as the rubber additive. Specific examples of such a commercially available product of the rubber additive include CTBN1300, ATBN1300-16, and CTBN1008-SP manufactured by UBE INDUSTRIES, LTD., silicone rubber powders (trade name: AY42-119 and the like) manufactured by Dow Corning Toray Co., Ltd., and rubber powders (trade name: XER81 and the like) manufactured by JSR Corporation, and the rubber additive is not limited to these specific examples. The rubber additive may be used singly, or in combination of two or more kinds thereof.

—Coupling Agent—

The sealing resin composition may contain a coupling agent as a component (E). The sealing resin composition preferably contains a coupling agent from the viewpoint of adhesion of the sealing resin composition.

The coupling agent is not particularly limited, and can be appropriately selected from conventionally known coupling agents and thus used. Examples include silane-based compounds such as aminosilane having at least one selected from the group consisting of a primary amino group, a secondary amino group, and a tertiary amino group, epoxysilane, mercaptosilane, alkylsilane, ureidosilane, and vinylsilane; and titanate-based compounds. In particular, an epoxysilane compound is preferable from the viewpoint of adhesion of the sealing resin composition.

A commercially available product may also be used as the coupling agent. Specific examples of such a commercially available product of the coupling agent include KBM-403, KBE-903, and KBE-9103 manufactured by Shin-Etsu Chemical Co., Ltd., and the coupling agent is not limited to these specific examples. The coupling agent may be used singly, or in combination of two or more kinds thereof.

—Other Component(s)—

The sealing resin composition may further contain, if necessary, any other component(s) for an enhancement in workability, such as a thixotropic agent, a pigment such as carbon black, a dye, an ion trapper, a defoamer, a leveling agent, an antioxidant, a reactive diluent, and an organic solvent, as long as the object of the disclosure is not impaired.

The sealing resin composition can be obtained by, for example, collectively or separately subjecting the epoxy resin, the specified curing agent, the inorganic filler, and other component(s) if necessary used, to stirring, melting, mixing, dispersing, and the like, with application of an optional heating treatment. In particular, a solid specified curing agent may cause an increase in viscosity due to compounding of such a specified curing agent as a solid, thereby resulting in deterioration in workability, and thus such a solid specified curing agent is preferably pre-heated and formed into a liquid specified curing agent, and then used. An apparatus for mixing, stirring, dispersing, and the like of such components is not particularly limited, and examples thereof include a grinding machine equipped with a stirrer, a heater, and/or the like, a triple roll mill, a ball mill, a planetary mill, and a bead mill. Such an apparatus can be used to mix and knead, and, if necessary, defoam the above components, thereby providing the sealing resin composition.

The viscosity of the sealing resin composition is not particularly limited. In particular, the viscosity at 25° C. is preferably from 0.1 Pa·s to 50.0 Pa·s, more preferably from 0.1 Pa·s to 20.0 Pa·s, still more preferably from 0.1 Pa·s to 10.0 Pa·s from the viewpoint of high fluidity. Herein, the viscosity of the sealing resin composition is measured at 25° C. with an E-type viscometer (cone angle 3°, rotational speed 10 rpm).

In a case in which the sealing resin composition is used in an underfill material application and the like, the sealing resin composition preferably has a viscosity at 110° C. of 0.20 Pa·s or less, more preferably 0.15 Pa·s or less, as an index of easiness of filling in filling of the sealing resin composition into a narrow gap having a size of from several tens micrometers to several hundreds micrometers around 100° C. to 120° C. The viscosity at 110° C. of the sealing resin composition is herein measured with a rheometer AR2000 (manufactured by TA Instruments, Inc., 40-mm aluminum cone, shear speed 32.5/sec).

The sealing resin composition preferably has a thixotropic index [(viscosity at 1.5 rpm)/(viscosity at 10 rpm)] of from 0.5 to 1.5, more preferably from 0.8 to 1.2, the index being the ratio of the viscosity at a rotational speed of 1.5 rpm and the viscosity at a rotational speed of 10 rpm measured with an E-type viscometer at 25° C. A thixotropic index falling within the above range provides a more enhancement in fillet forming properties in an underfill material application. The viscosity and the thixotropic index of the sealing resin composition can be within desired ranges by appropriate selection of, for example, the formulation of the epoxy resin and the content of the inorganic filler.

The curing conditions of the sealing resin composition are not particularly limited, and the composition is preferably heated at a temperature of from 80° C. to 165° C. for a period of from 1 minute to 150 minutes.

<Electronic Component Device>

The electronic component device of the disclosure includes a substrate having a circuit layer, an electronic component disposed on the substrate and electrically connected to the circuit layer, and a cured product of the sealing resin composition of the disclosure, disposed in a gap between the substrate and the electronic component. The electronic component device of the disclosure can be obtained by sealing the electronic component with the sealing resin composition of the disclosure. The electronic component is sealed with the sealing resin composition, whereby the electronic component device of the disclosure is excellent in temperature cycle resistance.

Examples of the electronic component device include an electronic component device obtained by mounting any electronic component including active elements such as a semiconductor chip, a transistor, a diode, and a thyristor, and passive elements such as a capacitor, a resistor, a resistor array, a coil, and a switch, on a substrate having a circuit layer, such as a lead frame, a tape carrier with wiring, a rigid wiring board, a flexible wiring board, glass, or a silicon wafer, and sealing a required portion with the sealing resin composition of the disclosure.

In particular, one subject to which the disclosure can be applied is a semiconductor device where a semiconductor element is flip-chip bonded to wiring formed on a rigid wiring board, a flexible wiring board, or glass by bump connection. Specific examples include electronic component devices such as a flip-chip BGA (Ball Grid Array), an LGA (Land Grid Array), and a COF (Chip On Film).

The sealing resin composition of the disclosure is suitable as an underfill material for a flip chip excellent in reliability. The sealing resin composition of the disclosure is particularly suitably to be applied to the field of flip chips, which involves a flip-chip semiconductor component using not a conventional lead-containing solder, but rather a lead-free solder of Sn—Ag—Cu or the like for a bump material that connects a wiring substrate and a semiconductor element. The sealing resin composition of the disclosure can allow favorable reliability to be maintained even in a flip chip bump-connected with a lead-free solder having brittle physical properties as compared with a conventional lead solder. The sealing resin composition of the disclosure can be applied also in mounting of a chip-scale package such as a wafer level CSP, to a substrate, thereby resulting in an enhancement in reliability.

<Method of Manufacturing Electronic Component Device>

The method of manufacturing an electronic component device of the disclosure includes a step of sealing, with the sealing resin composition of the disclosure, a substrate having a circuit layer and an electronic component disposed on the substrate and electrically connected to the circuit layer.

The step of sealing a substrate having a circuit layer and such an electronic component with the sealing resin composition of the disclosure is not particularly limited. Examples include a post-coating procedure involving connecting an electronic component and a substrate having a circuit layer, then providing the sealing resin composition to a gap between the electronic component and the substrate by use of capillarity, and then performing a curing reaction of the sealing resin composition, and a pre-coating procedure involving previously providing the sealing resin composition of the disclosure to a surface of at least one of a substrate having a circuit layer and an electronic component, and collectively performing connection of the electronic component and the substrate and a curing reaction of the sealing resin composition in connection of the electronic component to the substrate by thermal compression bonding.

Examples of the procedure for providing the sealing resin composition include an injection procedure, a dispensing procedure, and a printing procedure.

The sealing resin composition of the disclosure is used, whereby an electronic component device such as a flip chip mounted article suppressed in bleeding can be easily manufactured.

EXAMPLES

Hereinafter, the invention will be described based on Examples, but the invention is not intended to be limited to the following Examples. In the following Examples, "part(s)" and "%" means "part(s) by mass" and "% by mass", respectively, unless particularly noted.

Respective components were compounded so as to impart any formulation represented in Table 1 and Table 2, kneaded by a triple roll and a vacuum grinding machine, and dispersed, thereby producing each sealing resin composition of Example 1 to Example 9 and Comparative Example 1 to Comparative Example 7. Herein, the compounding unit is expressed by parts by mass and the symbol "-" means "not compounded", in each of the Tables. The content of the inorganic filler (% by mass) in the sealing resin composition was calculated from the amounts of such respective components compounded.

Examples 1 to 9 and Comparative Examples 1 to 7

The epoxy resins prepared were a bisphenol F-type epoxy resin (epoxy resin 1; manufactured by NIPPON STEEL & SUMIKIN CHEMICAL CO., LTD., product name "YDF-8170C", epoxy equivalent: 160 g/eq) and an amine-type epoxy resin having a trifunctional epoxy group (epoxy resin 2; manufactured by Mitsubishi Chemical Corporation, product name "jER630", epoxy equivalent: 95 g/eq).

The specified curing agents prepared were a diaminotoluene-type amine curing agent (amine curing agent 1; manufactured by Mitsubishi Chemical Corporation, product name "jER CureW") and a diaminodiphenylmethane-type amine curing agent (amine curing agent 2; manufactured by Nippon Kayaku Co., Ltd., product name "KAYAHARD-AA").

The inorganic fillers prepared were, as silica particles, an inorganic filler having an average particle size of 0.5 µm and a specific surface area of 4.5 $m^2/g$ (inorganic filler 1: manufactured by Admatechs, product name "SE2200-SEJ"), an inorganic filler having an average particle size of 50 nm and a specific surface area of 66 $m^2/g$ (inorganic filler 2: manufactured by Admatechs, product name "YA050C-SZ2), an inorganic filler having an average particle size of 10 nm and a specific surface area of 280 $m^2/g$ (inorganic filler 3: manufactured by Admatechs, product name "YA010C-SZ2"), an inorganic filler having an average particle size of 0.3 µm and a specific surface area of 14 $m^2/g$ (inorganic filler 4: manufactured by Admatechs, product name "SE1050"), an inorganic filler having an average particle size of 0.3 µm and a specific surface area of 15 $m^2/g$ (inorganic filler 5: manufactured by Admatechs, product name "SE1050-SET"), an inorganic filler having an average particle size of 0.3 µm and a specific surface area of 16 $m^2/g$ (inorganic filler 6: manufactured by Admatechs, product name "SE1030-SET"), an inorganic filler having an average particle size of 0.15 µm and a specific surface area of 30 $m^2/g$ (inorganic filler 7: manufactured by NIPPON SHOKUBAI CO., LTD., product name "KE-S10"), and an inorganic filler having an average particle size of 0.15 µm and a specific surface area of 30 $m^2/g$ (inorganic filler 8: manufactured by NIPPON SHOKUBAI CO., LTD., product name "KE-S10-HG").

Each of the sealing resin compositions obtained above was evaluated with respect to various properties, as described below. Respective numerical values are represented in Table 1 and Table 2 below.

(1) Fluidity: Viscosity and Thixotropic Index

The viscosity at 25° C. (viscosity at ordinary temperature, Pa·s) of the sealing resin composition was measured with an E-type viscometer (cone angle 3°, rotational speed 10 rpm). The thixotropic index at 25° C. was defined as the ratio of the viscosity at a rotational speed of 1.5 rpm and the viscosity at a rotational speed of 10 rpm [(viscosity at 1.5 rpm)/(viscosity at 10 rpm)]. The viscosity (Pa·s) at 110° C. was measured with a rheometer AR2000 (40-mm aluminum cone, shear speed 32.5/sec).

(2) Heat Resistance: Glass Transition Temperature (Tg) and Coefficient of Thermal Expansion (CTE)

A test piece (φ4 mm×20 mm) produced by curing the sealing resin composition in conditions of 165° C. and 2 hours was subjected to measurement with a thermal mechanical analyzer (manufactured by TA Instruments, Inc., product name TMAQ400) in conditions of a load of 15 g, a measurement temperature of from −50° C. to 220° C., and a rate of temperature rise of 5° C./min.

The coefficient of thermal expansion in a temperature range of Tg or less was defined as "CTE1" and the coefficient of thermal expansion in a temperature range of Tg or more was defined as "CTE2". Tg and CTEs each represent thermal stability, and Tg is preferably within a range of from about 100° C. to 130° C., and lower CTE1 and CTE2 are more preferable.

(3) Bleeding: Measurement of Length of Bleeding

A solder resist substrate was subjected to an $Ar_2$ plasma treatment (400 W, 2 minutes), and 30 mg of the sealing resin composition filled into a syringe was discharged through a 20-G needle and potted on the solder resist substrate subjected to an $Ar_2$ plasma treatment, and cured at 150° C. for 120 minutes. After the curing, the length of bleeding was measured with an optical microscope. The substrate used was FR-4 (MRC-E-679 manufactured by Hitachi Chemical Co., Ltd.) on which a solder resist (PSR-4000-AUS703 manufactured by TAIYO HOLDINGS CO., LTD.) was formed. The length of bleeding is preferably 500 μm or less, more preferably 400 μm or less, still more preferably 350 μm or less.

TABLE 1

| | | Unit | Example 1 | 2 | 3 | 4 | 5 | 6 | 7 | 8 | 9 |
|---|---|---|---|---|---|---|---|---|---|---|---|
| Epoxy resin 1 | YDF-8170C | parts | 50 | 50 | 50 | 50 | 50 | 50 | 50 | 50 | 50 |
| Epoxy resin 2 | jER630 | | 50 | 50 | 50 | 50 | 50 | 50 | 50 | 50 | 50 |
| Amine curing agent 1 | jER CureW | | 26.4 | 26.4 | 26.4 | 26.4 | 26.4 | 26.4 | 26.4 | 26.4 | 26.4 |
| Amine curing agent 2 | KAYAHARD-AA | | 18.9 | 18.9 | 18.9 | 18.9 | 18.9 | 18.9 | 18.9 | 18.9 | 18.9 |
| Inorganic filler 1 | SE2200-SEJ | | 199.8 | 181.6 | 163.5 | 216.1 | 214.3 | 207.0 | 198.0 | 196.0 | 189.0 |
| Inorganic filler 2 | YA050C-SZ2 | | 18.2 | 36.3 | 54.5 | — | — | — | 18.2 | 18.2 | 18.2 |
| Inorganic filler 3 | YA010C-SZ2 | | — | — | — | 1.8 | 3.6 | 10.9 | 1.8 | 3.6 | 10.9 |
| Inorganic filler 4 | SE1050 | | — | — | — | — | — | — | — | — | — |
| Inorganic filler 5 | SE1050-SET | | — | — | — | — | — | — | — | — | — |
| Inorganic filler 6 | SE1030-SET | | — | — | — | — | — | — | — | — | — |
| Inorganic filler 7 | KE-S10 | | — | — | — | — | — | — | — | — | — |
| Inorganic filler 8 | KE-S10-HG | | — | — | — | — | — | — | — | — | — |
| Inorganic filler | Content of second inorganic filler | % | 8.3 | 16.7 | 25.0 | 0.8 | 1.7 | 5.0 | 9.2 | 10.0 | 13.3 |
| | Total content of inorganic filler | | 60 | 60 | 60 | 60 | 60 | 60 | 60 | 60 | 60 |
| | Specific surface area × proportion of inorganic filler | $m^2/g$ | 5.8 | 8.9 | 11.9 | 4.1 | 5.4 | 10.9 | 7.1 | 8.5 | 14.0 |
| Fluidity | Viscosity at ordinary temperature | Pa·s | 9.5 | 10.7 | 12.1 | 11.8 | 13.0 | 18.7 | 13.9 | 13.2 | 19.5 |
| | Thixotropic index | — | 0.8 | 0.9 | 1.0 | 0.8 | 0.8 | 0.8 | 0.7 | 0.9 | 0.9 |
| | Viscosity at 110° C. | Pa·s | 0.08 | 0.11 | 0.11 | 0.08 | 0.08 | 0.09 | 0.08 | 0.08 | 0.10 |
| Heat resistance | Tg | ° C. | 124 | 122 | 121 | 123 | 124 | 125 | 124 | 124 | 124 |
| | CTE1 | ppm/° C. | 30 | 30 | 31 | 30 | 30 | 30 | 30 | 30 | 30 |
| | CTE2 | | 90 | 91 | 93 | 87 | 91 | 95 | 91 | 91 | 94 |
| Bleeding | AUS703 | μm | 240 | 230 | 215 | 311 | 218 | 147 | 198 | 193 | 133 |

TABLE 2

| | | Unit | Comparative Example 1 | 2 | 3 | 4 | 5 | 6 | 7 |
|---|---|---|---|---|---|---|---|---|---|
| Epoxy resin 1 | YDF-8170C | parts | 50 | 50 | 50 | 50 | 50 | 50 | 50 |
| Epoxy resin 2 | jER630 | | 50 | 50 | 50 | 50 | 50 | 50 | 50 |
| Amine curing agent 1 | jER CureW | | 26.4 | 26.4 | 26.4 | 26.4 | 26.4 | 26.4 | 26.4 |
| Amine curing agent 2 | KAYAHARD-AA | | 18.9 | 18.9 | 18.9 | 18.9 | 18.9 | 18.9 | 18.9 |
| Inorganic filler 1 | SE2200-SEJ | | 217.9 | 145.3 | — | — | — | — | — |
| Inorganic filler 2 | YA050C-SZ2 | | — | — | — | — | — | — | — |
| Inorganic filler 3 | YA010C-SZ2 | | — | — | — | — | — | — | — |
| Inorganic filler 4 | SE1050 | | — | — | 145.3 | — | — | — | — |
| Inorganic filler 5 | SE1050-SET | | — | — | — | 145.3 | — | — | — |
| Inorganic filler 6 | SE1030-SET | | — | — | — | — | 145.3 | — | — |
| Inorganic filler 7 | KE-S10 | | — | — | — | — | — | 145.3 | — |
| Inorganic filler 8 | KE-S10-HG | | — | — | — | — | — | — | 145.3 |
| Inorganic filler | Content of second inorganic filler | % | 0 | 0 | 0 | 0 | 0 | 0 | 0 |
| | Total content of inorganic filler | | 60 | 50 | 50 | 50 | 50 | 50 | 50 |
| | Specific surface area × proportion of inorganic filler | $m^2/g$ | 2.7 | 2.3 | 7.0 | 7.6 | 8.2 | 15.0 | 15.0 |
| Fluidity | Viscosity at ordinary temperature | Pa·s | 8.5 | 3.9 | 4.7 | 5.1 | 5.9 | 4.5 | 4.0 |
| | Thixotropic index | — | 0.8 | 0.9 | 1.2 | 1.2 | 1.1 | 1.6 | 1.5 |
| | Viscosity at 110° C. | Pa·s | 0.09 | 0.05 | 0.15 | 0.19 | 0.17 | 0.44 | 0.36 |
| Heat resistance | Tg | ° C. | 127 | 122 | 122 | 123 | 123 | 113 | 111 |
| | CTE1 | ppm/° C. | 31 | 36 | 37 | 37 | 37 | 38 | 38 |
| | CTE2 | | 97 | 108 | 110 | 108 | 110 | 112 | 116 |
| Bleeding | AUS703 | μm | 517 | 453 | 358 | 474 | 548 | 448 | 428 |

"Content of second inorganic filler" in Table 1 and Table 2 means the proportion of the second inorganic filler in the inorganic filler.

"Specific surface area×proportion of inorganic filler" in Table 1 and Table 2 means "the value obtained by multiplying the specific surface area of the inorganic filler by the proportion of the mass of the inorganic filler in the solid mass".

As clear from the results in Table 1 and Table 2, it was found that the sealing resin composition of each of Examples 1 to 9 was excellent in bleeding as compared with the sealing resin composition of each of Comparative Examples 1 to 7.

All Documents, Patent Applications, and technical standards described herein are incorporated by reference herein to the same extent as if each of the Documents, Patent Applications, and technical standards had been specifically and individually indicated to be incorporated by reference.

The invention claimed is:

1. A sealing resin composition comprising:
   an epoxy resin (A), a curing agent (B) having at least one amino group in one molecule, and an inorganic filler (C), wherein:
   the inorganic filler (C) comprises a first inorganic filler (C1) having an average particle size from 0.1 µm to 20 µm and a second inorganic filler (C2) having an average particle size from 10 nm to 80 nm,
   a value obtained by multiplying a specific surface area of the inorganic filler (C), by a proportion of a mass of the inorganic filler (C) in a solid mass of the sealing resin composition, is 4.0 m$^2$/g or more, and
   the sealing resin composition has a viscosity, at 25° C., from 0.1 Pa·s to 50.0 Pa·s.

2. The sealing resin composition according to claim 1, having a viscosity, at 110° C., of 0.20 Pa·s or less.

3. The sealing resin composition according to claim 1, wherein a proportion of the second inorganic filler (C2) having an average particle size from 10 nm to 80 nm in the inorganic filler (C) is 0.3% by mass or more.

4. The sealing resin composition according to claim 1, wherein a proportion of the second inorganic filler (C2) having an average particle size from 10 nm to 80 nm in the inorganic filler (C) is 30% by mass or less.

5. The sealing resin composition according to claim 1, wherein a proportion of the first inorganic filler (C1) having an average particle size from 0.1 µm to 20 µm in the inorganic filler (C) is 70% by mass or more.

6. The sealing resin composition according to claim 1, wherein the first inorganic filler (C1) having an average particle size from 0.1 µm to 20 µm comprises silica.

7. The sealing resin composition according to claim 1, wherein the second inorganic filler (C2) having an average particle size from 10 nm to 80 nm comprises silica.

8. The sealing resin composition according to claim 1, wherein a content of the inorganic filler (C) is from 40% by mass to 85% by mass.

9. The sealing resin composition according to claim 1, wherein a specific surface area of the first inorganic filler (C1) having an average particle size from 0.1 µm to 20 µm is from 1 m$^2$/g to 30 m$^2$/g.

10. The sealing resin composition according to claim 1, wherein a specific surface area of the second inorganic filler (C2) having an average particle size from 10 nm to 80 nm is from 20 m$^2$/g to 500 m$^2$/g.

11. The sealing resin composition according to claim 1, having a thixotropic index, at 25° C., from 0.5 to 1.5.

12. The sealing resin composition according to claim 1, wherein the sealing resin composition has a viscosity, at 25° C., from 0.1 Pa·s to 20.0 Pa·s.

13. The sealing resin composition according to claim 1, wherein the sealing resin composition has a viscosity, at 25° C., from 0.1 Pa·s to 10.0 Pa·s.

14. The sealing resin composition according to claim 1, wherein the epoxy resin (A) comprises an epoxy resin that is liquid at 25° C.

15. An electronic component device comprising:
    a substrate having a circuit layer,
    an electronic component disposed on the substrate and electrically connected to the circuit layer, and
    a cured product of the sealing resin composition according to claim 1, disposed in a gap between the substrate and the electronic component.

16. A method of manufacturing an electronic component device, comprising:
    a step of sealing, with the sealing resin composition according to claim 1, a substrate having a circuit layer and an electronic component disposed on the substrate and electrically connected to the circuit layer.

* * * * *